(12) United States Patent
Mizunashi

(10) Patent No.: US 8,077,466 B2
(45) Date of Patent: Dec. 13, 2011

(54) HEAT SINK, SEMICONDUCTOR DEVICE, AND METHOD OF MANUFACTURING HEAT SINK

(75) Inventor: Harumi Mizunashi, Kanagawa (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 12/805,204

(22) Filed: Jul. 19, 2010

(65) Prior Publication Data
US 2011/0044007 A1    Feb. 24, 2011

(30) Foreign Application Priority Data
Aug. 20, 2009   (JP) .................. 2009-191456

(51) Int. Cl.
*H05K 7/20*   (2006.01)
*F28F 7/00*   (2006.01)
*H01L 23/34*  (2006.01)

(52) U.S. Cl. ....... 361/704; 165/80.2; 165/185; 257/707; 257/713; 361/717; 361/718; 361/722

(58) Field of Classification Search ............... None
See application file for complete search history.

(56) References Cited

U.S. PATENT DOCUMENTS

| | | | | |
|---|---|---|---|---|
| 5,289,039 | A * | 2/1994 | Ishida et al. | 257/796 |
| 5,900,670 | A * | 5/1999 | Schneider et al. | 257/718 |
| 5,977,626 | A * | 11/1999 | Wang et al. | 257/707 |
| 6,002,173 | A * | 12/1999 | Casati et al. | 257/739 |
| 6,035,524 | A * | 3/2000 | Suppa et al. | 29/832 |
| 6,172,415 | B1 * | 1/2001 | Ishijima et al. | 257/707 |
| 6,400,014 | B1 * | 6/2002 | Huang et al. | 257/712 |
| 6,462,405 | B1 * | 10/2002 | Lai et al. | 257/675 |
| 6,552,428 | B1 * | 4/2003 | Huang et al. | 257/706 |
| 6,818,981 | B2 * | 11/2004 | Shim et al. | 257/706 |
| 6,919,630 | B2 * | 7/2005 | Hsiao | 257/706 |
| 7,342,304 | B2 * | 3/2008 | Huang | 257/706 |
| 7,483,273 | B2 * | 1/2009 | Uehara et al. | 361/715 |

FOREIGN PATENT DOCUMENTS
JP   6-38257   5/1994

* cited by examiner

*Primary Examiner* — Gregory Thompson
(74) *Attorney, Agent, or Firm* — McGinn IP Law Group, PLLC

(57) ABSTRACT

A heat sink 109 is configured by a plate component having a combined structure composed of a recess and a projection formed thereon, wherein the recess is formed by allowing a part of the plate component to be set back from the surface level of the residual region, and the projection is formed on one surface of the plate component with the progress of formation of the recess, so as to be built up above the level of the residual region of the one surface.

28 Claims, 11 Drawing Sheets

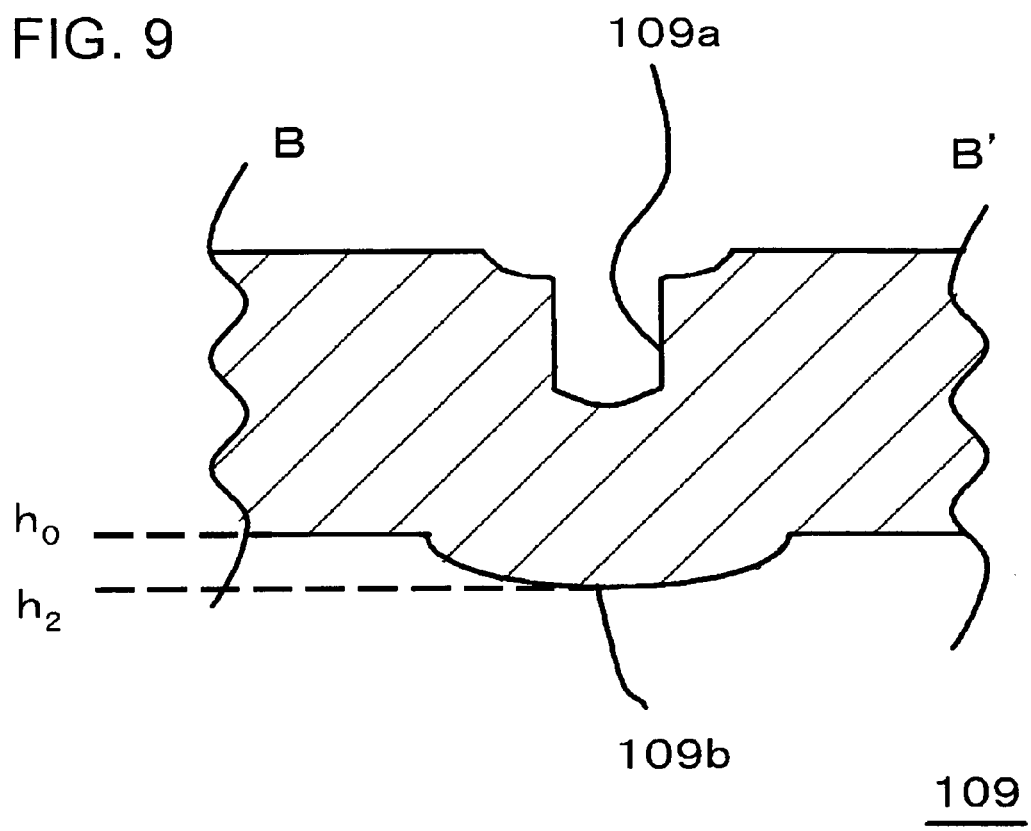

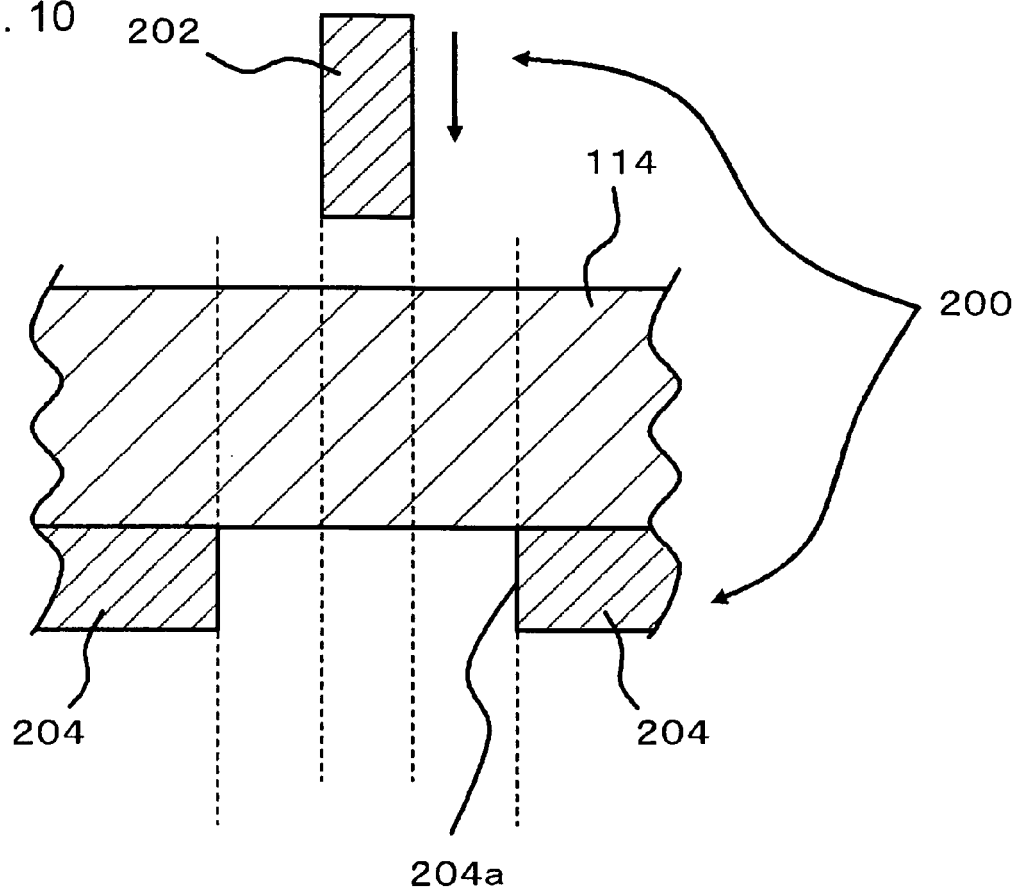

RELATED ART

FIG. 13A
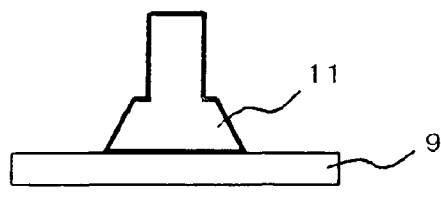
FIG. 13B
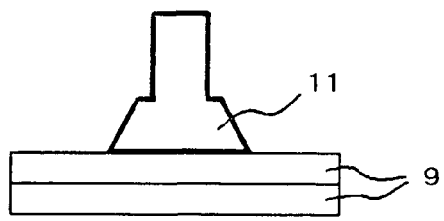
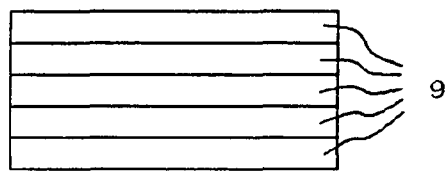
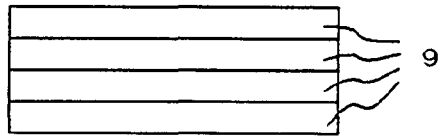
RELATED ART
RELATED ART

HEAT SINK, SEMICONDUCTOR DEVICE, AND METHOD OF MANUFACTURING HEAT SINK This application is based on Japanese patent application No. 2009-191456 the content of which is incorporated hereinto by reference.

BACKGROUND

1. Technical Field

The present invention relates to a heat sink, a semiconductor device, and a method of manufacturing a heat sink, and in particular to a heat sink which has a combined structure composed of a recess and a projection, a semiconductor device having the thus-configured heat sink, and a method of manufacturing the thus-configured heat sink.

2. Background Art

Advanced semiconductor devices have recently been becoming more heat emissive, with the progress of improvement in the operation speed. The semiconductor device may therefore be provided with a heat sink on one surface thereof, aiming at ensuring efficient heat radiation. FIG. 12 is a drawing illustrating a general configuration of a conventional semiconductor device 50.

The semiconductor device 50 contains an interconnect board 1, a semiconductor chip 2 mounted on the interconnect board 1, and a heat sink 9 disposed over the semiconductor chip 2. Illustrated herein is an exemplary case where the semiconductor chip 2 is bonded to the interconnect board 1 while placing bumps 3 in between, by flip-chip bonding. The semiconductor chip 2 is electrically connected through the bumps 3 to terminals on the interconnect board 1, and adhered to the interconnect board 1 while placing a resin layer (underfill) 6 in between. On the outer periphery of the semiconductor chip 2 on the interconnect board 1, a reinforcing plate 5 is provided. The reinforcing plate 5 is adhered to the interconnect board 1 while placing an adhesive layer 4 in between. The heat sink 9 is adhered to the semiconductor chip 2 and to the reinforcing plate 5, while placing a resin layer 7 and an adhesive layer 8, respectively, in between. The resin layer 7 may be configured by a material, such as an electro-conductive paste, having a large thermal conductivity. On the surface of the interconnect board 1, opposite to the surface having the semiconductor chip 2 mounted thereon, external terminals 10 are provided.

In the process of assembly of the semiconductor device 50 illustrated in FIG. 12, a problem has been known in a step of disposing the heat sink 9 onto the semiconductor chip 2 of each semiconductor device 50. The problem will be explained referring to FIGS. 13A and 13B. In the process of bonding the heat sink 9 using an automated machine, the heat sinks 9 before being bonded are housed in a predetermined space in the machine, and then fed out therefrom for bonding. Larger number of heat sinks 9 housed therein may be efficient, in view of reducing the number of times of supplementation. For the purpose of increasing the number of housing, the heat sinks 9 are often kept stacked in the vertical direction. One heat sink 9 is picked up by a suction head 11 from the stack of the heat sinks 9, as illustrated in FIG. 13A, and is then transferred. However, in this process, a plurality of heat sinks 9 may occasionally be picked up under suction, and may be transferred in a stacked manner as illustrated in FIG. 13B.

Japanese Laid-Open Utility Publication No. H06-38257 describes a configuration of a heat sink having, on one surface thereof, a projection-like plated film formed at each of four corners. This configuration is reportedly successful in preventing the heat sinks from being picked up under suction in a stacked manner. According to the configuration described in the publication, the projections are provided on one surface of the heat sink by plating. According to the description, the heat sink herein is typically composed of copper, iron-nickel alloy or the like, and the plated film may therefore be formed by spot plating directly onto the heat sink.

SUMMARY

The configuration described in Japanese Laid-Open Utility Publication No. H06-38257 has, however, been suffering from a problem explained below. If the process of forming the projections relies upon plating, it may be necessary to provide a mask, and to give plating only partially to the portions where the projections are formed later, for the purpose of achieving the thickness of the projections as thick enough as preventing the heat sinks from being picked up under suction in a stacked manner.

The process of manufacturing is, however, labor-consuming and costly. Even for the case where also the heat sink per se is directly plated, an additional process of plating will be still necessary, so that the number of times to repeat the plating will consequently increase, and the cost of manufacturing will elevate.

According to the present invention, there is provided a heat sink configured by a plate component having a combined structure composed of a recess and a projection formed thereon. The recess is formed by allowing a part of the plate component to be set back from the surface level of the residual region, and the projection is formed on one surface of the plate component with the progress of formation of the recess, so as to be built up above the level of the residual region of the one surface.

According to the present invention, there is also provided a semiconductor device which includes a substrate; a semiconductor element mounted on the substrate; and the above-described heat sink disposed over the semiconductor element.

According to the present invention, there is still also provided a method of manufacturing a heat sink configured by a plate component. The method includes forming a recess by allowing a part of the plate component to be set back from the surface level of the residual region, and also forming a projection on one surface of the plate component with the progress of formation of the recess, so as to be built up above the level of the residual region of the one surface, to thereby form a combined structure composed of the recess and the projection.

According to these configurations, the projection is formed by applying external mechanical force to a part of the heat sink so as to cause deformation. The heat sink having the projection formed on one surface thereof may, therefore, be obtained by simple procedures at a low cost. By virtue of the configurations, the heat sinks may now be prevented from being picked up in a stacked manner, when the heat sink is necessarily transferred with the aid of a suction head in the process of bonding, even if the heat sinks are housed in a stacked manner.

Note that also all arbitrary combinations of the above-described constituents, and all exchanges of expression of the present invention made among method, device and so forth will be valid as embodiments of the present invention.

According to the present invention, a structure of a heat sink used for semiconductor devices, capable of preventing the heat sinks from adhering with each other in the process of manufacturing, may be formed by simple procedures at a low cost.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9 is an enlarged sectional view illustrating a configuration of the heat sink illustrated in FIG. 8;

FIG. 10 is a sectional view illustrating a procedure of manufacturing the heat sink in one embodiment of the present invention;

FIGS. 13A and 13B are drawings for explaining problems in a conventional heat sink.

DETAILED DESCRIPTION

Figure 1:
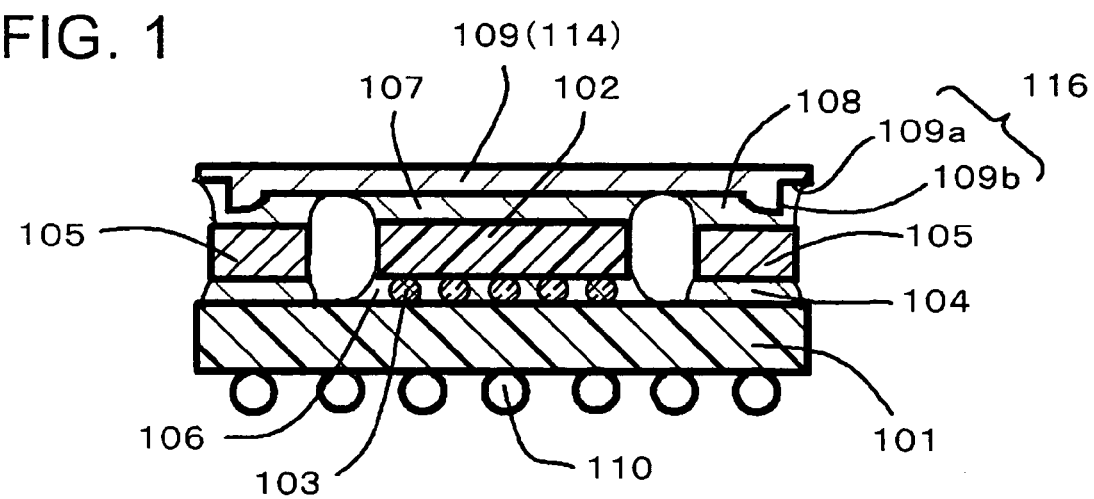
FIG. 1 is a drawing illustrating a configuration of a semiconductor device in one embodiment of the present invention.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that, all similar constituents in all drawings will be given similar reference numerals or symbols, so that the relevant explanation will not always necessarily be repeated.

FIG. 1 is a sectional view illustrating a configuration of a semiconductor device in this embodiment.

A semiconductor device 100 contains an interconnect board 101, a semiconductor chip 102 (semiconductor element) mounted on the interconnect board 101, and a heat sink 109 disposed over the semiconductor chip 102. Illustrated herein is an exemplary case where the semiconductor chip 102 is bonded to the interconnect board 101 while placing bumps 103 in between, by flip-chip bonding. The bumps 103 are formed on electrode terminals (not illustrated) of the semiconductor chip 102. In the flip-chip bonding, the electrode terminals of the semiconductor chip 102 and electrode terminals of the interconnect board 101 are opposed with each other, and the electrode terminals are electrically connected through the bumps 103. This configuration may successfully improve the operation speed, since the electrode terminals of the semiconductor chip 102 and the electrode terminals of the interconnect board 101 may be connected by the shortest path. The configuration is advantageous also in that the heat sink 109 adapted to the amount of heat production of the semiconductor chip 102 may readily be attached to the back surface of the semiconductor chip 102 which is available in an exposed manner. The bumps 103 herein may be configured by using tin-lead alloy, tin-silver alloy, tin-silver-copper alloy, gold-tin alloy, gold or the like.

Between the semiconductor chip 102 and the interconnect board 101, a resin layer (underfill) 106 is formed for the purpose of protecting the bumps 103 and improving adhesiveness between the semiconductor chip and the interconnect board 101. The resin layer 106 may be configured by a thermo-setting resin layer. On the surface of the interconnect board 101 opposite to the surface having the semiconductor chip 102 mounted thereon, external terminals 110 are provided. The external terminal 110 may typically be configured using tin-lead alloy, tin-silver alloy, tin-silver-copper alloy or the like.

On the outer periphery of the semiconductor chip 102 on the interconnect board 101, a reinforcing plate 105 is provided. The reinforcing plate 105 is adhered to the interconnect board 101 while placing an adhesive layer 104 in between. The heat sink 109 is adhered to the semiconductor chip 102 and to the reinforcing plate 105, while placing a resin layer 107 and an adhesive layer 108, respectively, in between. The resin layer 107 may be configured by a material, such as an electro-conductive paste, having a large thermal conductivity.

In this embodiment, the heat sink 109 is configured by a plate component 114. The plate component 114 has combined structures 116 each of which is composed of a recess 109a which is formed by allowing a part of the plate component 114 to be set back from the surface level of the residual region, and a projection 109b which is formed as a result of deformation of the plate component 114 with the progress of formation of the recess 109a, so as to be built up above the level of the residual region.

Figure 2A:
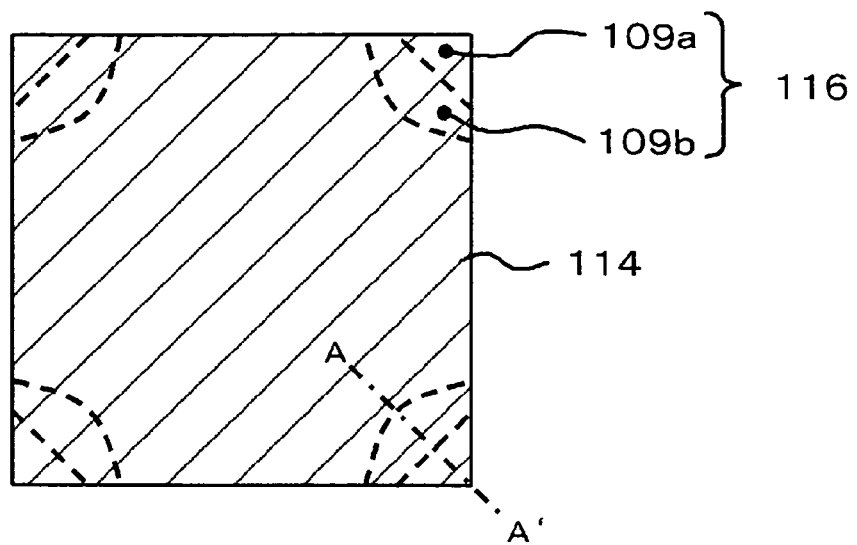
FIGS. 2A and 2B are drawings illustrating an exemplary configuration of a heat sink in one embodiment of the present invention.
Figure 2B:
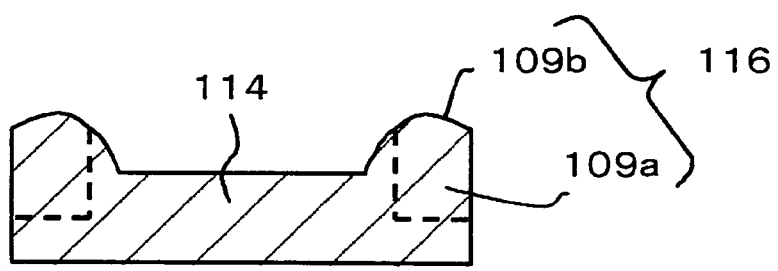
Figure 3:
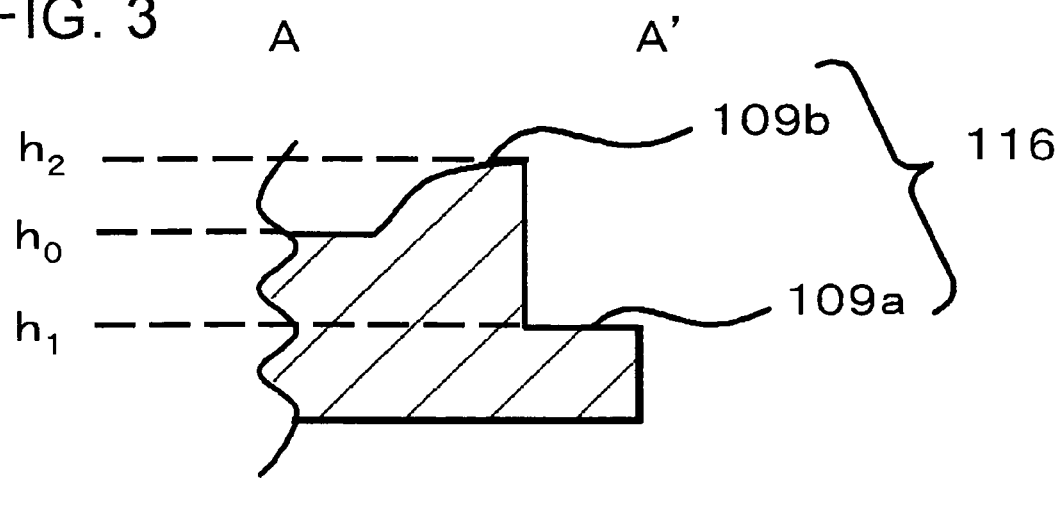
FIG. 3 is an enlarged sectional view illustrating the configuration of the heat sink illustrated in FIG. 2.

FIGS. 2A and 2B are drawings illustrating an exemplary configuration of the heat sink 109 in this embodiment. FIG. 2A is a plan view of the heat sink 109, and FIG. 2B is a side elevation of the heat sink 109. FIG. 3 is a sectional view taken along line A-A' in FIG. 2A.

The combined structure 116 herein, composed of the recess 109a and the projection 109b, is formed at the corner of the plate component 114. The combined structure 116, composed of the recess 109a and the projection 109b, may be formed at each of three or more corners out of four corners of the plate component 114. In the illustrated embodiment, the combined structure 116 composed of the recess 109a and the projection 109b is formed at each of all four corners of the plate component 114.

Figure 4A:
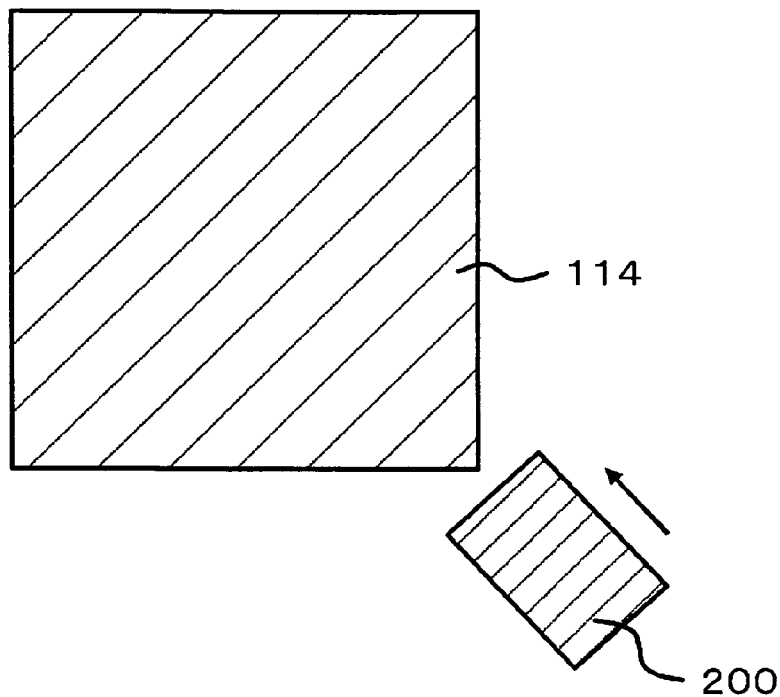
FIGS. 4A and 4B are plan views illustrating procedures of manufacturing the heat sink in one embodiment of the present invention.
Figure 4B:
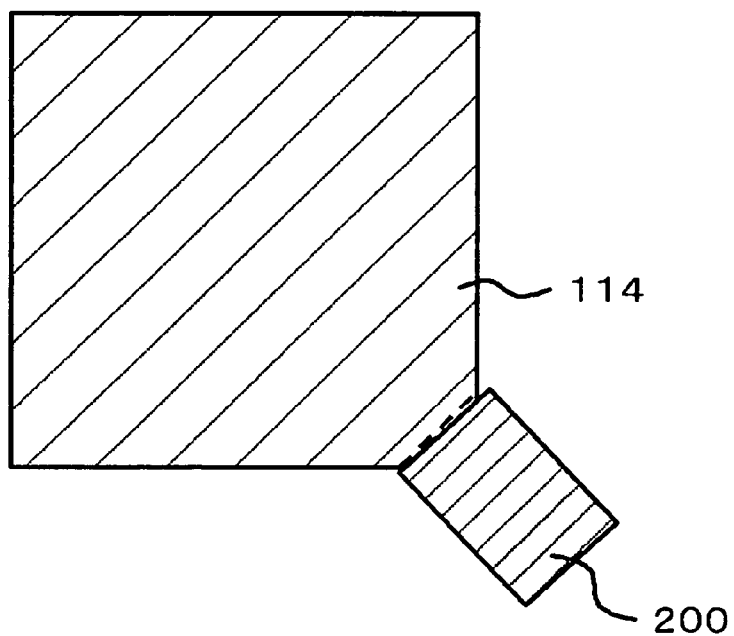
Figure 5A:
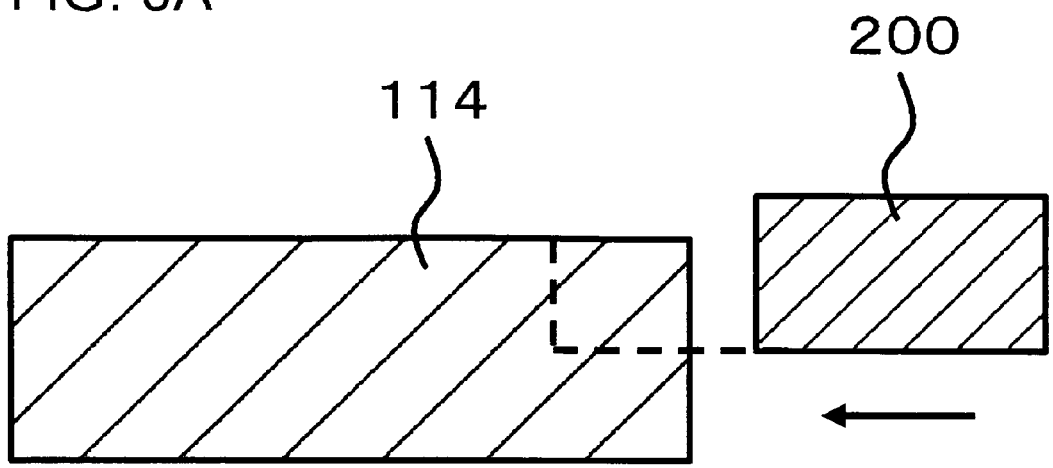
FIGS. 5A and 5B are sectional views illustrating procedures of manufacturing the heat sink in one embodiment of the present invention.
Figure 5B:
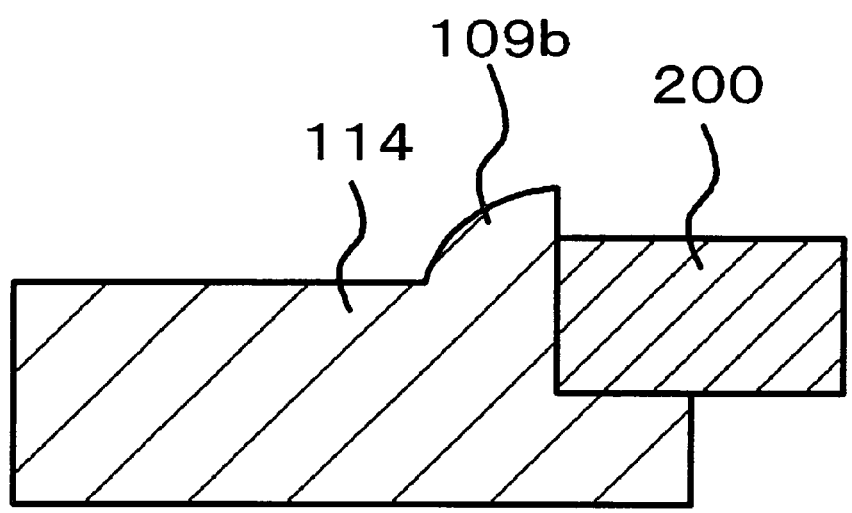

Paragraphs below will describe procedures of manufacturing the heat sink 109 in this embodiment. FIGS. 4A and 4B are plan views illustrating the procedures of manufacturing the heat sink 109 in this embodiment. FIGS. 5A and 5B are sectional views illustrating the procedures of manufacturing the heat sink 109 in this embodiment.

In this embodiment, the plate component 114 before being processed, is given as a flat plate having a rectangular geometry in a plan view. The plate component 114 may be configured by using, for example, a metal material which is composed of a metal sheet and a plated film of copper (oxygen-free copper, for example) formed on the surface thereof. The plated film herein may be a semi-glossy nickel film formed by electrolytic plating. In one example, the plate component 114, before being processed to have the combined structures 116, may have a thickness of metal sheet of 0.5 mm, a thickness of plated film of 1 to 3 µm, and a 32.1 mm×32.1 mm square geometry in a plan view. The plate component 114 may be formed by punching, after being plated on the surface of the metal sheet, according to procedures similar to those in the conventional process.

In this embodiment, the thus-configured plate component 114 is then pressed in a surficial portion on one surface side thereof, from each end towards the center, so as to form the recess 109a and the projection 109b on one surface side, to thereby obtain the combined structure 116. More specifically, the plate component 114 is pressed in a suficial portion on one surface side (top surface in FIGS. 5A and 5B), from the side face at each corner, using a shaping tool 200 (FIG. 4A, FIG. 5A). By applying external mechanical force to the plate component 114 in this way, so as to allow the side face on one surface side of the plate component 114 to be partially set back to form the recess 109a, a material previously resides in the recessed portion is driven out therefrom, and thereby the projection 109b is formed (FIG. 4B, FIG. 5B). While the drawings illustrate an exemplary case where the shaping tool 200 is pressed onto the side face of a single corner, the similar pressing may respectively be effected onto the side face of each of four corners. As described in the above, the projection 109b of the combined structure 116 in this embodiment is formed as a result of deformation of the plate component 114 with the progress of formation of the recess 109a. For this reason, the recess 109a and the projection 109b in each combined structure 116 have the same volume.

Referring now back to FIG. 1, in this embodiment, the heat sink 109 may be disposed on the semiconductor chip 102 so as to oppose the one surface, having the combined structure 116 formed thereon, to the semiconductor chip 102. In this way, the heat sink 109 may successfully keep flatness of the surface on the opposite side of the one surface. As a consequence, the heat sink 109 may be improved in the cooling efficiency, after a heat radiating component such as cooling unit, making use of a radiation fin, liquid cooling element, Peltier element or the like, was attached to the opposite surface thereof.

The heat radiation effect herein may be improved, by bringing the one surface side of the heat sink 109 close to the semiconductor chip 102. From this point of view, difference ($h_2 - h_0$) between the level of height $h_2$ of the projection 109b of the combined structure 116, measured from the level of height $h_0$ of the residual projection 109b, may be set to 25 µm or smaller, for example (see FIG. 3). By adjusting the difference of height ($h_2 - h_0$) to this range, the projection 109b may be made not affective to the thickness of the adhesive layer 108, and thereby the semiconductor device 100 may be assembled in an efficient manner. On the other hand, in view of preventing the adhesion of the heat sinks 109 under suction, the difference of height ($h_2 - h_0$) may be adjusted to approximately 10 µm or larger, for example.

Figure 6:
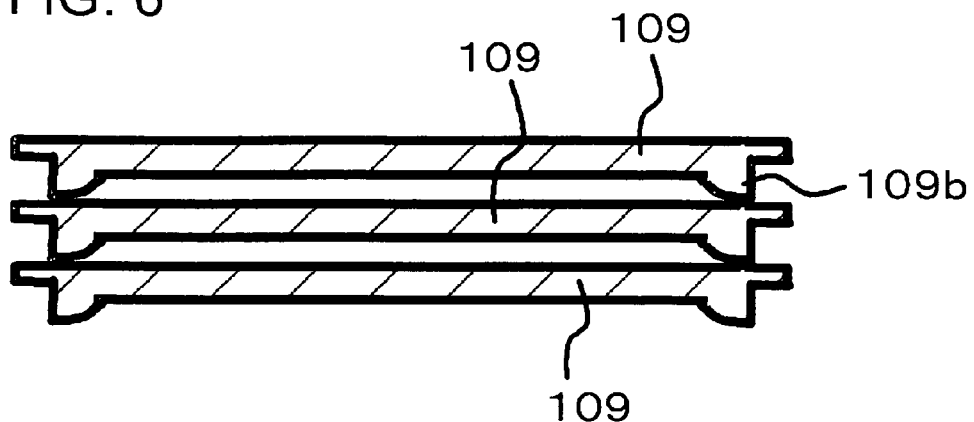
FIG. 6 is a sectional view illustrating a state of stacking of a plurality of heat sinks.

FIG. 6 is a sectional view illustrating a state of stacking of a plurality of the heat sinks 109 explained referring to FIG. 1 to FIG. 5B.

Since the projections 109b are provided on one surface of each heat sink 109, a plurality of the heat sinks 109 may be stacked while keeping a gap in between. Accordingly, the heat sinks 109 may be prevented from adhering under suction with each other. As a consequence, the heat sinks 109 may be transferred one by one using a suction head, when they are necessarily transferred in the process of bonding. Since the heat sinks 109 may be prevented from adhering under suction, even when they are transferred using the suction head at a high speed, by virtue of provision of the projections 109b onto each heat sink 109, so that also working efficiency may be improved. According to the heat sink 109 and the method of manufacturing the same in this embodiment, the projection 109b may be formed by a simple procedure without needing any special working, so that the heat sink 109 may be manufactured while exerting less impact on the price.

Figure 7:
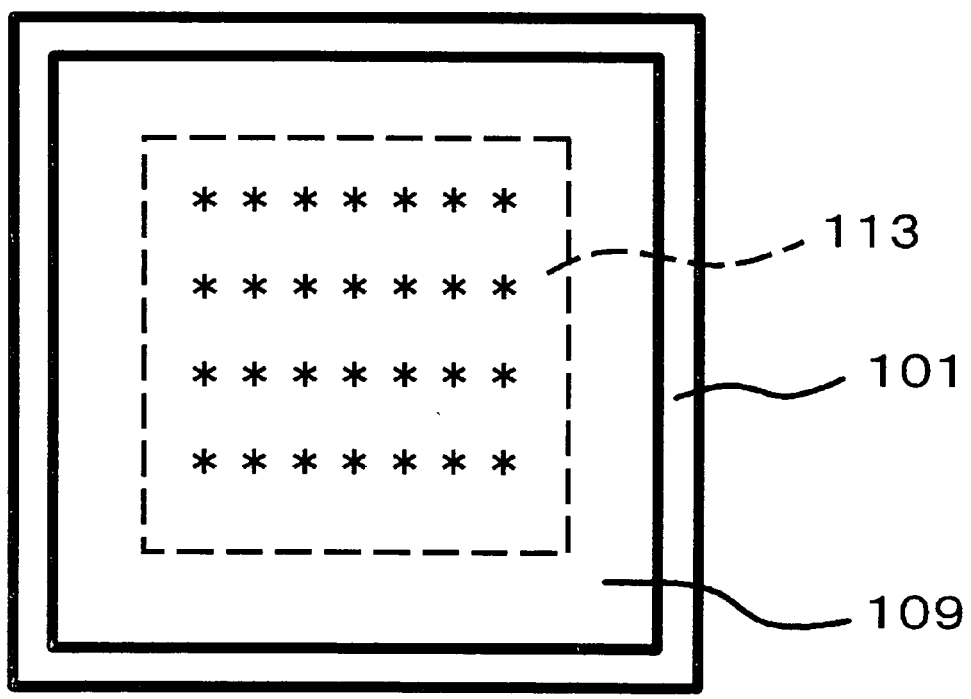
FIG. 7 is a plan view illustrating a configuration of a semiconductor device in one embodiment of the present invention.

In addition, since the opposite surface of the heat sink 109 is kept flat, so that a marking region 113 having a marking given therein on the opposite surface may ensure a good recognizability as illustrated in FIG. 7. Each symbol "*" in the marking region 113 illustrated in FIG. 7 represents a marked character. According to the configuration of the heat sink 109 in this embodiment, quality of marking may be improved without limiting the marking region 113.

Figure 8A:
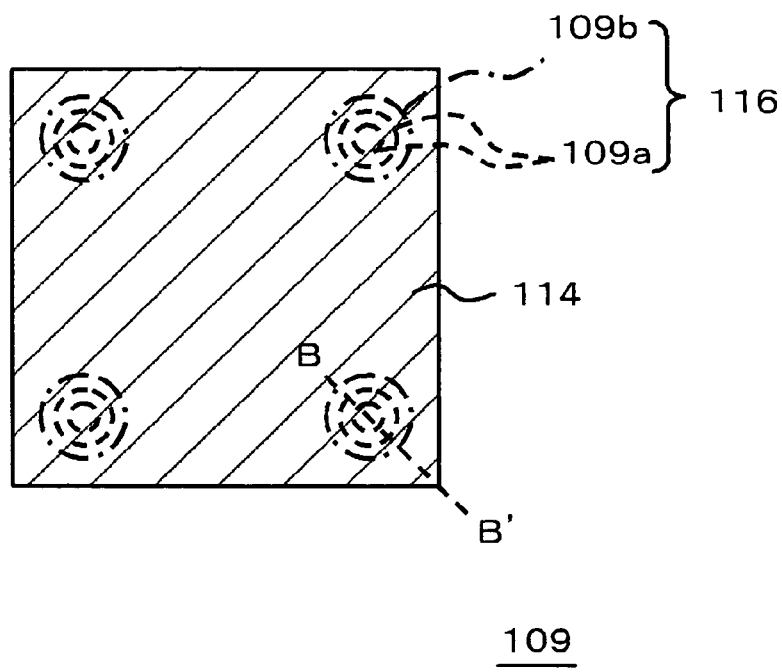
FIGS. 8A and 8B are drawings illustrating another exemplary configuration of the heat sink in one embodiment of the present invention.
Figure 8B:
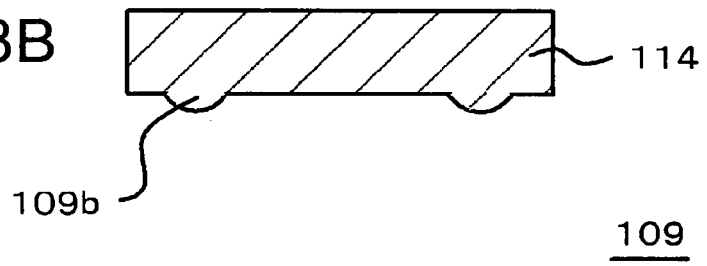

FIGS. 8A and 8B are drawings illustrating another example of the heat sink 109 in this embodiment. FIG. 8A is a plan view of the heat sink 109, and FIG. 8B is a side elevation of the heat sink 109. FIG. 9 is a sectional view taken along line B-B' in FIG. 8A.

The combined structure 116 herein is configured to have the recess 109a formed by allowing the other surface of the plate component 114 to set back, and to have the projection 109b consequently formed on one surface opposite to the other surface. The recess 109a and the projection 109b have cross-sectional geometries different from each other. Also in this case, the combined structure 116 composed of the recess 109a and the projection 109b are formed at each of four corners of the plate component 114.

Next, procedures of manufacturing the heat sink 109 in this embodiment will be explained. FIG. 10 is a sectional view illustrating a procedure of manufacturing the heat sink 109 in this embodiment.

In the illustrated example, the shaping tool 200 is configured by a punch 202 and a die 204. Also in this case, the configuration of the plate component 114 before being processed may be same as that explained referring to FIGS. 4A, 4B and FIGS. 5A, 5B. The processing for forming the combined structure 116 in this example may be carried out at the same time the outer contour of the plate component 114 is determined by punching.

A die 204 is disposed on one surface side (on the lower surface side in the drawing) of the thus-configured plate component 114, and a punch 202 is pressed into the plate component 114 from above the other surface side (on the top surface side in the drawing) thereof. The die 204 has an opening 204a, the diameter of which is larger than that of the punch 202. The plate component 114 is then applied with an external mechanical force to be partially set back on the other surface thereof, so as to form the recess 109a, and the material previously resides in the recessed portion is driven out from the recessed portion to thereby form the projection 109b on the one surface side.

In this process, since the diameter of opening 204a is set larger than that of the punch 202, the projection 109b may be made wider relative to the deformation of the recess 109a. Accordingly, in each combined structure 116, the recess 109a and the projection 109b may have the cross-sectional geometries different from each other. Also in this case, the projection 109b of the combined structure 116 may be formed as a result of deformation of the plate component 114 with the progress of formation of the recess 109a. For this reason, the recess 109a and the projection 109b in each combined structure 116 have the same volume.

The diameter of the punch 202 herein may be adjusted to 0.3 mm, for example. The diameter of the opening 204a of the die 204 in this case may be adjusted to 1 mm, for example. Also in this example, the difference ($h_2-h_0$) between the level of height $h_2$ of the projection 109b of the combined structure 116, measured from the level of height $h_0$ of the residual projection 109b, may be set to 25 μm or smaller, for example (see FIG. 9). The difference of height ($h_2-h_0$) may typically be set to 10 μm or larger and 25 μm or smaller.

Figure 11:
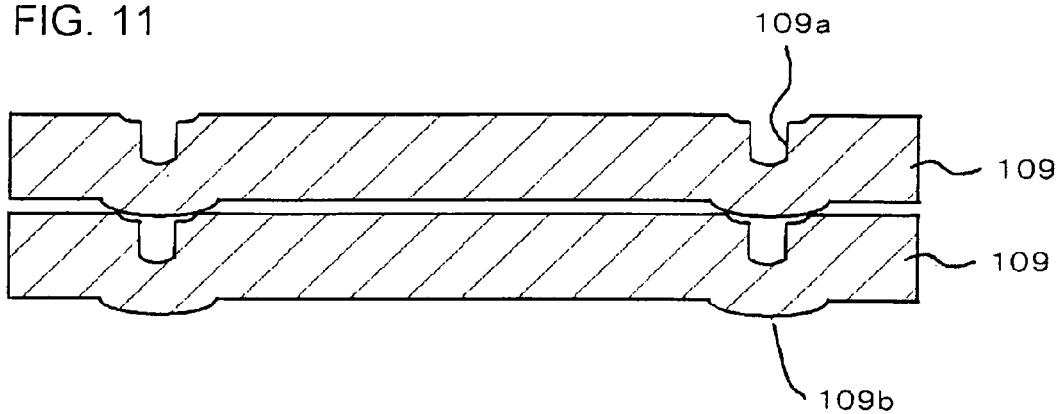
FIG. 11 is a sectional view illustrating a state of stacking of a plurality of heat sinks.
Figure 12:
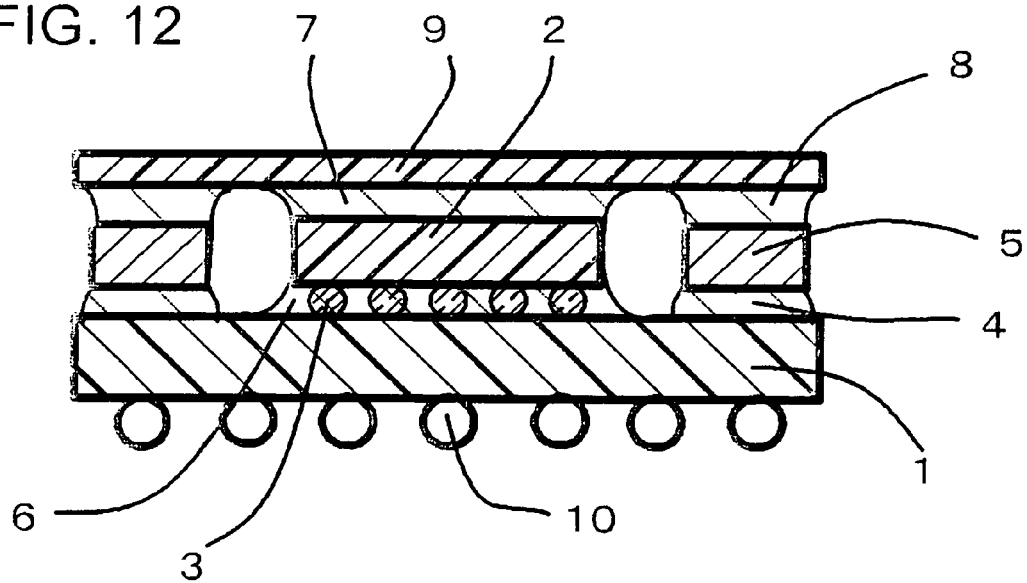
FIG. 12 is a sectional view illustrating a configuration of a conventional semiconductor device.

FIG. 11 is a sectional view illustrating a state of stacking of a plurality of the heat sinks 109 explained referring to FIG. 8A to FIG. 10.

The projections 109b are provided to the one surface of the heat sink 109. The recess 109a and the projection 109b of the heat sink 109 have cross-sectional geometries different from each other. The diameter of the projection 109b of the upper heat sink 109 in the stack is larger than the diameter of the recess 109a of the lower heat sink 109. The projection 109b is therefore allowed to partially stay outside the recess 109a, so that a plurality of heat sinks 109 may be stacked while keeping a gap in between. In this way, the heat sinks 109 may be prevented from adhering under suction. As a consequence, the heat sinks 109 may be transferred one by one using a suction head, when the heat sinks 109 are necessarily transferred in the process of bonding. Since the heat sinks 109 may be prevented from adhering under suction by virtue of provision of the projections 109b onto each heat sink 109 even when the heat sinks 109 are transferred using the suction head at a high speed, so that also working efficiency may be improved.

According to the heat sink 109 and the method of manufacturing the same in this embodiment, the projection 109b may be formed by a simple procedure without needing any special working, so that the heat sink 109 may be manufactured while exerting less impact on the price. In addition, since the projection 109b may be formed at the same time the outer contour of the plate component 114 is determined by punching, so that the projection 109b may be formed on the heat sink 109 with a less number of processes.

The embodiments of the present invention have been described merely for exemplary purposes, while allowing adoption of various configurations other than those described in the above.

It is apparent that the present invention is not limited to the above embodiments, that may be modified and changed without departing from the scope and spirit of the invention.

What is claimed is:

1. A heat sink configured by a plate component including a combined structure comprising a recess and a projection formed thereon, said recess being formed such that a part of said plate component is set back from a surface level of a residual region of said plate component, and said projection being formed on one surface of said plate component with a progress of formation of said recess, to project outwardly from the surface level of the residual region such that an upper surface of said projection extends from said one surface of said plate component to a sidewall of said recess.

2. The heat sink according to claim 1, wherein said combined structure of said recess and said projection is formed at a corner of said plate component.

3. The heat sink according to claim 1, wherein said combined structure comprising said recess and said projection is formed at each of three or more corners out of four corners of said plate component.

4. The heat sink according to claim 1, wherein said combined structure is obtained by pressing a surficial portion of said plate component on one surface side thereof, from an end towards a center, so as to form said recess and said projection on said one surface.

5. The heat sink according to claim 1, wherein said combined structure is obtained by allowing said plate component to be set back from the surface level opposite to said one surface, so as to form said recess, and so as to concomitantly form said projection on said one surface, said recess and said projection having different cross-sectional geometries.

6. The heat sink according to claim 1, wherein said projection and said recess have an equal volume.

7. The heat sink according to claim 1, wherein said plate component comprises a metal material.

8. A semiconductor device, comprising:
a substrate;
a semiconductor element mounted on said substrate; and
a heat sink disposed over said semiconductor element,
wherein said heat sink configured by a plate component including a combined structure comprising a recess and a projection formed thereon, said recess being formed such that a part of said plate component is set back from a surface level of a residual region of said plate component, and said projection being formed on one surface of said plate component with a progress of formation of said recess, to project outwardly from the surface level of the residual region such that an upper surface of said projection extends from said one surface of said plate component to a sidewall of said recess.

9. The semiconductor device according to claim 8, wherein said heat sink is disposed, with said projection formed thereon, to oppose said semiconductor element.

10. A method of manufacturing a heat sink configured by a plate component, said method comprising:
forming a recess by allowing a part of said plate component to be set back from a surface level of a residual region of said plate component; and
forming a projection on one surface of said plate component with a progress of formation of said recess to project outwardly from the surface level of the residual region such that an upper surface of said projection extends from said one surface of said plate component to a sidewall of said recess, to thereby form a combined structure comprising said recess and said projection.

11. The method of manufacturing a heat sink according to claim 10, wherein in said forming said combined structure, said recess and said projection are formed on one surface side of said plate component, by pressing a surficial portion of said plate component on said one surface side thereof, from an end towards a center.

12. The method of manufacturing a heat sink according to claim 10, wherein in said forming said combined structure, said plate component is set back from the surface level to form said recess on said other surface, and so as to concomitantly form said projection having a cross-sectional geometry different from that of said recess on said one surface.

13. The semiconductor device according to claim 8, wherein said combined structure comprising said recess and said projection is formed at a corner of said plate component.

14. The semiconductor device according to claim 8, wherein said combined structure comprising said recess and said projection is formed at each of three or more corners out of four corners of said plate component.

15. The semiconductor device according to claim 8, wherein said combined structure is obtained by pressing a surficial portion of said plate component on one surface side thereof, from an end towards a center, so as to form said recess and said projection on said one surface.

16. The semiconductor device according to claim 8, wherein said combined structure is obtained by allowing said plate component to be set back from the surface level opposite to said one surface, so as to form said recess, and so as to concomitantly form said projection on said one surface, said recess and said projection having different cross-sectional geometries.

17. The semiconductor device according to claim 8, wherein said projection and said recess have an equal volume.

18. The semiconductor device according to claim 8, further comprising:
  another combined structure comprising another recess and another projection similar in shape with said recess and said projection, respectively,
  wherein said another combined structure and said combined structure are disposed at opposing corners of said plate component, and
  wherein a gap continuously extends from said another combined structure to said combined structure.

19. The semiconductor device according to claim 8, wherein with respect to said one surface, a height of said upper surface of said projection continuously increases from the surface level of the residual region to the sidewall of said recess.

20. The semiconductor device according to claim 8, wherein said sidewall of said recess forms a side of the projection and said upper surface of said projection continuously extends from said one surface of said plate component to form another side of the projection.

21. The semiconductor device according to claim 8, wherein a height of said upper surface of said projection in a side of said projection that intersects with said sidewall of said recess is more than a height of said projection on other points on said upper surface of said projection.

22. The semiconductor device according to claim 8, wherein said combined structure of said recess and said projection is formed in at least a corner of said plate component such that said sidewall of said recess forms a side of the projection.

23. The semiconductor device according to claim 8, wherein said heat sink is disposed with said projection formed thereon opposing said substrate, and said projection is formed in an outward area from said semiconductor element.

24. The semiconductor device according to claim 23, further comprising a reinforcing plate disposed between said substrate and said heat sink,
  wherein said projection is disposed over said reinforcing plate.

25. The method of manufacturing a heat sink according to claim 10, wherein said combined structure comprising said recess and said projection is formed in at least a corner of said plate component such that said sidewall of said recess forms a side of the projection.

26. The method of manufacturing a heat sink according to claim 10, further comprising:
  forming another combined structure comprising another recess and another projection similar in shape with said recess and said projection, respectively,
  wherein said another combined structure and said combined structure are disposed at opposing corners of said plate component, and
  wherein a continuous gap extends from said another combined structure to said combined structure.

27. The method of manufacturing a heat sink according to claim 10, wherein with respect to said one surface, a height of said upper surface of said projection continuously increases from the surface level of the residual region to the sidewall of said recess, and
  wherein said sidewall of said recess forms a side of the projection and said upper surface of said projection continuously extends from said one surface of said plate component to form another side of the projection.

28. The method of manufacturing a heat sink according to claim 10, wherein a height of said upper surface of said projection in a side of said projection that intersects with said sidewall of said recess is more than a height of said projection on other points on said upper surface of said projection.

* * * * *